US005596531A

United States Patent [19]
Liu et al.

[11] Patent Number: 5,596,531
[45] Date of Patent: Jan. 21, 1997

[54] METHOD FOR DECREASING THE DISCHARGE TIME OF A FLASH EPROM CELL

[75] Inventors: David K. Y. Liu, Cupertino; Ming S. Kwan, San Leandro; Chi Chang, Redwood City; Sameer Haddad; Yuan Tang, both of San Jose, all of Calif.

[73] Assignee: Advanced Micro Devices, Inc., Sunnyvale, Calif.

[21] Appl. No.: 450,167

[22] Filed: May 25, 1995

[51] Int. Cl.$^6$ .................................................. G11C 7/00
[52] U.S. Cl. .................... 365/185.31; 365/185.33
[58] Field of Search .................. 365/185.31, 900, 365/185.33; 437/43

[56] References Cited

U.S. PATENT DOCUMENTS

| | | | |
|---|---|---|---|
| 5,210,047 | 5/1993 | Woo et al. | 437/43 |
| 5,440,158 | 8/1995 | Sung-Mu | 365/185 |

*Primary Examiner*—David C. Nelms
*Assistant Examiner*—Trong Phan

*Attorney, Agent, or Firm*—Benman Collins & Sawyer

[57] ABSTRACT

The present invention presents methods for reducing the discharge time of a Flash EPROM cell. In one aspect, a method includes the steps of forcing an ultraviolet voltage threshold, $UVV_t$, below a discharge threshold voltage, $V_t$. The method further comprises reducing the $UVV_t$ to about 0 V. Further, the method further comprises the step of reducing a core cell implant of a p-type dopant into a substrate of the cell. In a further aspect, a method for decreasing the discharge time includes the steps of providing a core cell implant of a p-type dopant into a surface of a substrate of the cell, and providing a surface doping of an n-type dopant into the core of the substrate, where the core implant reduces punchthrough and the surface doping of an n-type dopant reduces $V_t$ in the cell. In yet another aspect, a method for decreasing a discharge time of a Flash EPROM cell while reducing punchthrough includes the steps of providing a high energy core cell implant of a p type dopant into a substrate of the cell, wherein the core has a doping concentration profile with a low dopant concentration at a surface of the core to reduce $UVV_t$ and a high dopant concentration at lower than the surface to reduce punchthrough.

14 Claims, 5 Drawing Sheets

METHOD FOR DECREASING THE DISCHARGE TIME OF A FLASH EPROM CELL

FIELD OF THE INVENTION

The present invention relates to Flash EPROM cell structures, and more particularly to Flash EPROM cell structures for low energy flash applications using the Fowler-Nordheim tunneling mechanism for charging and discharging.

BACKGROUND OF THE INVENTION

Typical Flash EPROM (ultraviolet erasable programmable read only memory) cell structures are either charged or discharged in order to program or erase the cells. In general terms, charging refers to the activity of putting electrons onto a floating gate of the cell, while discharging refers to the activity of taking electrons off of the floating gate of the cell. When charged, the cell has a low current and a high threshold voltage, $V_t$. Conversely, when discharged, the cell has a high current and a low $V_t$. The charged $V_t$ and discharged $V_t$ are usually determined by the sensing circuitry. In the present state of the art, a typical charged $V_t$ is usually 5 V, and a typical discharged $V_t$ is usually 2 V. In addition, in general, the ultraviolet threshold voltage ($UVV_t$), which is used to define the $V_t$ of the device when the floating gate does not have any charge, i.e., when in a charge neutral state, is also about 2 V, making the discharged state and the UV erased state the same.

In a system having multiple cells, charging and discharging of the cells are done either on a bit-by-bit basis or on a global basis. In applications where Fowler Nordheim tunneling mechanism is used for discharging/charging operations, the global or bulk method is used to charge the cells. Typically, this global method is slow and performed during a slower system operation, such as a reset operation. The bit-by-bit method is preferably used for discharging the cells. For most applications, the speed of this bit-by-bit discharging is fast, preferably less than about 100 microseconds (µs).

Prior attempts to reduce the speed of discharging have not been entirely successful. Typically, an attempt has been made to increase the voltage applied at a gate of the cell ($V_{pp}$) in order to increase the floating gate potential and correspondingly increase the tunnel oxide voltage. The increase in the tunnel oxide voltage results in electrons being driven out of the cell faster. However, the voltage applied at the gate of the cell is produced by an internal charge pump, which is commonly limited by efficiency and typically capable of producing a voltage potential of only about 9–10 V. Further, even if the charge pump were capable of producing a higher voltage potential, usually the peripheral transistor elements of the system can only efficiently support a maximum voltage of ±10 V, since higher voltage support requirements would greatly increase the complexity of the process.

What is needed therefore is a Flash EPROM, core cell structure that has a fast discharge time, but that does not require an increase in applied voltage potential.

SUMMARY OF THE INVENTION

The present invention presents methods for reducing the discharge time of a Flash EPROM cell. In one aspect, a method includes the steps of making the ultraviolet voltage threshold, $UVV_t$, to be below the discharge threshold voltage, $V_t$. The method further comprises reducing the $UVV_t$ of the present invention to 0 V or about 2 V below the conventional $UVV_t$. Further, the method further comprises the step of reducing a core cell implant of a p-type dopant into a substrate of the cell to achieve a low $UVV_t$.

In a further aspect, a method for decreasing the discharge time while reducing punchthrough includes the steps of providing a core cell implant of a p-type dopant into a substrate of the cell to reduce punchthrough and providing a surface doping of an n-type dopant into the core of the substrate. The surface doping of an n-type dopant reduces the surface concentration of p-type dopant in the cell and thus lowers the $UVV_t$ for the cell.

In yet another aspect, a method for decreasing a discharge time of a Flash EPROM cell while reducing punchthrough includes the steps of providing a high energy core cell implant of a p type dopant into a substrate of the cell, wherein the core has a doping concentration profile with a low dopant concentration at a surface of the core to reduce $UVV_t$ and a high dopant concentration at lower than the surface to reduce punchthrough.

With the present invention, the discharge time of a Flash EPROM cell is reduced by utilizing the built-in Electric field generated from the potential difference between the ultraviolet discharge threshold voltage and the discharge threshold voltage for the cell. In addition, the present invention describes a method of using charge on the floating gate and the resultant built in electric field to increase the electric field across the tunnel oxide. In a straightforward manner, the present invention reduces the amount of the p-type core cell implant at the surface of the core to achieve the reduction in discharge time.

These and other advantages of the aspects of the present invention will be more fully understood in conjunction with the following detailed description and accompanying drawings.

DETAILED DESCRIPTION OF THE PREFERRED EMBODIMENTS

The present invention relates to decreasing the discharge time for a Flash EPROM cell. The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 1:
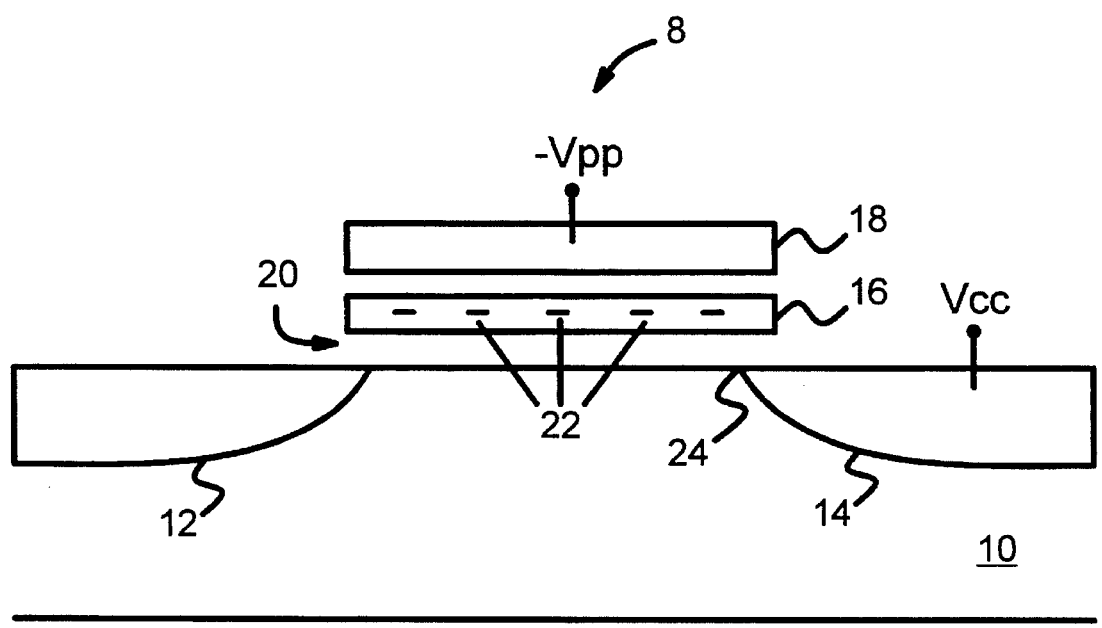
FIG. 1 illustrates a partial, cross-sectional view of a prior art Flash EPROM cell.

As shown in FIG. 1, a partial cross-sectional view of a prior art Flash EPROM cell 8 includes a substrate 10, a source region 12, a drain region 14, a floating gate 16, and a control gate 18. A tunnel oxide region 20, having a thickness of between about 80–100 angstroms, lies between the substrate 10 and floating gate 16. Typically, the substrate 10 is doped with a p-type dopant, such as boron, while the source and drain regions are doped with an n-type dopant, such as phosphorous or arsenic, as is well known to those skilled in the art. As is further well understood, a core implant of boron of approximately $10^{17}$ atoms/cm$^3$ is usually done at the surface of the substrate 10. This surface doping typically creates an ultraviolet threshold voltage, UVVt, approximately equal to the discharge threshold voltage, $V_t$, for example 2 V.

The charge on the floating gate 16 is represented by the negative charge (–) symbols 22. Of course, the number of symbols 22 merely represents the charge on a typical floating gate 16 and is not intended to be an accurate count of the electrons existing on the gate 16. When a negative voltage potential Vpp (about –9 to –10 V) is supplied from a charge pump to the control gate 18 and a positive voltage Vcc (about 4–5 V) is supplied from a power supply to the drain 14 for a discharge operation, electrons move from the floating gate 16 to the drain region 14, as represented by lines 24. It is the length of time required to reduce the charge on the floating gate 16 to a discharge state that determines the speed of the discharge operation.

For cells, such as that shown in FIG. 1, formed in accordance with the Fowler-Nordheim method, the discharge time is dependent on the current conduction in the cell in accordance with the following equations.

$$V_{cc} - V_{fg} = V_{tox} \tag{1}$$

$$V_{fg} = -\alpha_g V_{pp} + \alpha_g (-\Delta V_t) \tag{2}$$

$V_{cc}$ corresponds to the power supply voltage, $V_{fg}$ corresponds to the floating gate voltage, $V_{tox}$ corresponds to the tunnel oxide voltage, $V_{pp}$ corresponds to the internal charge pump high negative voltage, $\alpha_g$ corresponds the gate coupling ratio, and $\Delta V_t$ corresponds to the voltage shift induced by the charge on the floating gate and the charge neutral $V_t$ state, or the difference between $V_t$ of the Flash cell and its UVV$_t$.

As seen by these equations, in order to reduce the discharge time by increasing the tunnel oxide voltage ($V_{tox}$), either $V_{cc}$ must increase or $V_{fg}$ must be more negative. Increasing $V_{cc}$, the power supply voltage, however, would not be practical since circuit elements within the system are designed for a known power supply level. Therefore, the latter approach of making $V_{fg}$ more negative is undertaken.

As shown by equation (2), in order to make $V_{fg}$ more negative, either $V_{pp}$ or $\Delta V_t$ must become more negative, since the gate coupling ratio value, approximately 0.5–0.6, is considered a constant. As discussed above, there is an upper limit to $V_{pp}$ due to the susceptibility of the peripheral devices to breakdown as the magnitude of the applied voltage increases. Thus, the present invention is directed toward increasing the value of $\Delta V_t$ in order to decrease the discharge time for the cell.

The quantity $\Delta V_t$ signifies the difference in potential between the UVV$_t$ and the cell $V_t$. Of course, the value changes during discharge operations as electrons are being removed from the floating gate, as is well understood by those skilled in the art. UVV$_t$ usually is changed by changing the substrate doping. Normally, UVV$_t$ preferably matches the discharge voltage of about 2 V. Thus, for typical cells, $\Delta V_t$ is about 0 V at discharge state and about 3 V during charge state where the charge $V_t$ is 5 V, as discussed above. In the present invention, UVV$_t$ is designed to be below the discharge voltage to increase $\Delta V_t$ and thus increase the tunnel oxide voltage.

Figure 2:
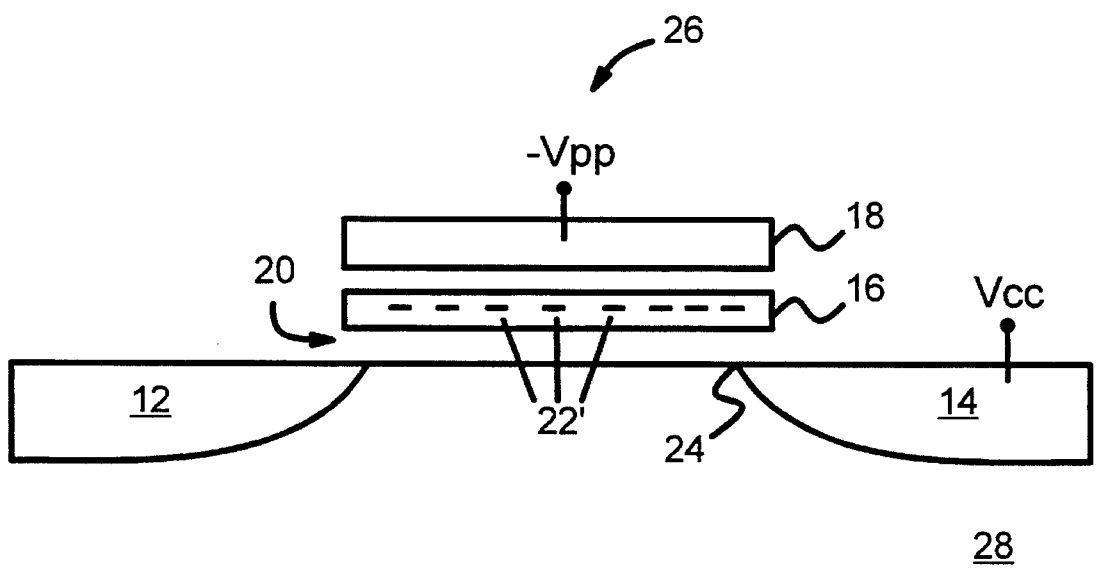
FIG. 2 illustrates a partial, cross-sectional view of a Flash EPROM cell formed in accordance with the present invention.

A partial cross-sectional view of a Flash EPROM cell 26 in accordance with one embodiment of the present invention is illustrated in FIG. 2, in which cell parts having like characteristics to the cell of FIG. 1 are numbered the same. As shown, cell 26 differs from the prior art cell 8 by having a substrate 28 which differs from substrate 10. Substrate 28 has a reduced core cell implant (e.g., boron) to reduce a surface doping in the cell. Preferably, the core cell implant is eliminated to reduce the UVV$_t$ to about 0 V or lower than 0 V. This reduction in the core cell implant results in an increase in the amount of charge on the floating gate, as represented by the increased number of negative charge symbols 22' when both cells 26 and 8 are at a charge $V_t$ of 5 V. The increase in the amount of charge on the floating gate 16 acts as a built-in E-field (electric field) in the cell 26, which creates the appearance of an increased negative voltage potential on the control gate 18.

Further, the reduction in UVV$_t$ results in an increase in $\Delta V_t$, since UVV$_t$ and discharge $V_t$ are no longer equal. The increase in $\Delta V_t$ causes $V_{fg}$ to become more negative, as seen by equation (2). Correspondingly, as seen by equation (1), this results in the desired increase in Vtox and thus decrease the discharge time without requiring an increase in an applied gate voltage potential. The following graphs further illustrate these results.

Figure 3:
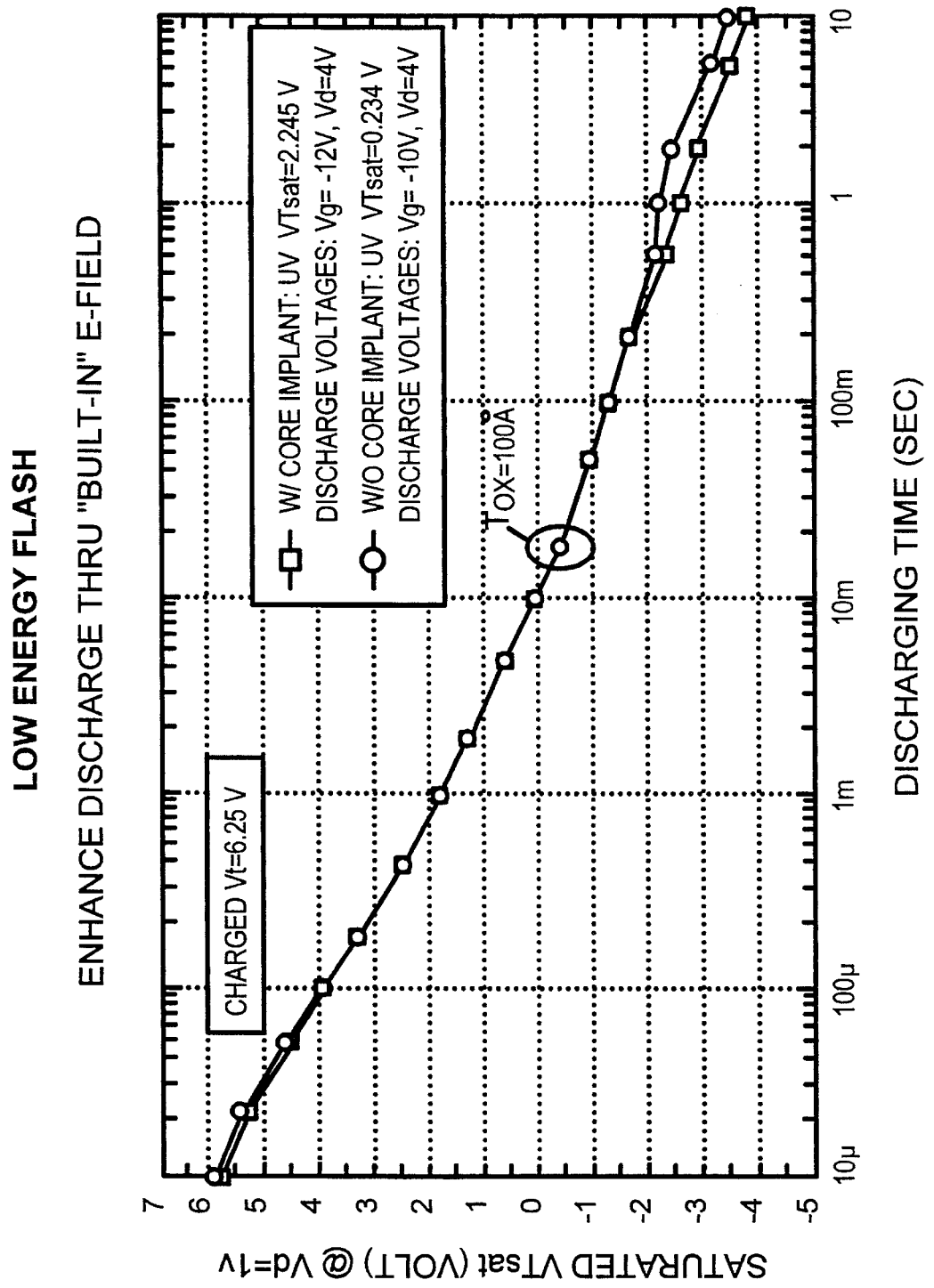
FIG. 3 is a graph of discharge threshold voltage versus discharge time for a prior art cell and a cell formed in accordance with the present invention with each cell having differing gate voltage bias conditions.

FIG. 3 is a graph illustrating the saturated threshold voltage for the cell (in volts) versus the discharging time for the cell (in seconds). Two sets of conditions were used to produce the plots on the graph. The line having points designated with a square was produced using a cell structure having a typical core implant and a tunnel oxide thickness of about 100 angstroms, a UVV$_t$ of about 2 V, and applied potentials of $V_{pp}$=–12 V and $V_{cc}$=4 V. The line having points designated by a circle was produced using a cell having a reduced core implant and a tunnel oxide thickness of about 100 angstroms, a UVV$_t$ of about 0 V, and applied potentials of $V_{pp}$=–10 V and $V_{cc}$=4 V. As is clearly seen in these two plots, the discharge time for the cell substantially without the core implant appears the same as for the cell with the core implant and an applied $V_{pp}$ 2 V higher than the cell substantially without the implant. Thus, the reduction of the core implant to reduce UVV$_t$ has the desired effect of increasing the $V_{tox}$ such that the same discharge time can be obtained with a lower applied control gate voltage. In other words, reduction in discharging time can be achieved without requiring an increase in the applied voltage potentials.

Figure 4:
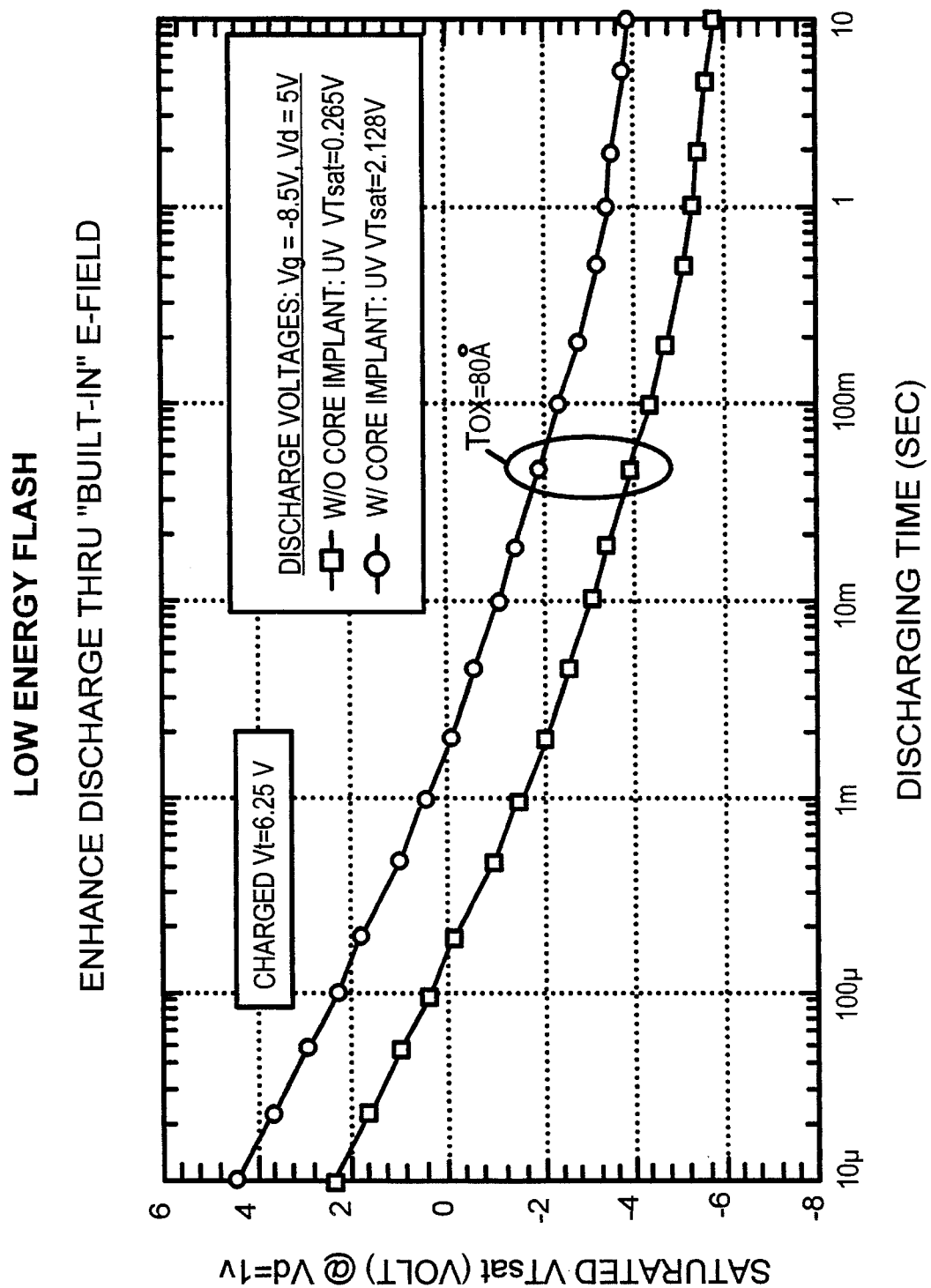
FIG. 4 is a graph of discharge threshold voltage versus discharge time for a prior art cell and a cell formed in accordance with the present invention with each cell having the same gate voltage bias conditions.

FIG. 4 illustrates a second graph further supporting the reduction in discharge time for a cell produced in accordance with the present invention. Again, the saturated threshold voltage (Vtsat) for a cell (in volts) versus the discharging time for a cell (in seconds) is plotted using data from two cells. In contrast to the previous example, for these plots, the same voltage potentials of $V_{pp}$=–8.5 V and $V_{cc}$=5 V were used for both cells with each cell having a tunnel oxide thickness of about 80 angstroms. The square points represent data obtained using a cell substantially without a core implant, having a UVV$_t$ of about 0 V, while the circle points represent data gathered using a cell with a typical core implant, having a $UVV_t$ of about 2 V. As shown, the cell substantially without the core implant reaches a Vtsat of 2 V in less than 20 microseconds. The cell with the core implant reaches a Vtsat of 2 V in slightly over 100 microseconds. Thus, the cell substantially without the core implant reaches a discharge voltage level of 2 V approximately an order of magnitude faster than a cell having a core implant.

In addition to the reduction in discharge time, a further advantage to the cell structure having a reduced core cell implant is a higher mobility and thus a higher transconductance for the cell. With the reduced amount of dopant in the surface portion of the cell, carriers have a lesser chance of scattering and therefore move more freely and quickly in the channel of the cell. This increase in mobility further manifests itself in an improved access time for the cell and a higher current when accessed, i.e., a clearer reading of the cell's contents ("1" or "0" level), and in a reduced width of the core cell resulting in an overall reduction of the cell size.

Figure 5:
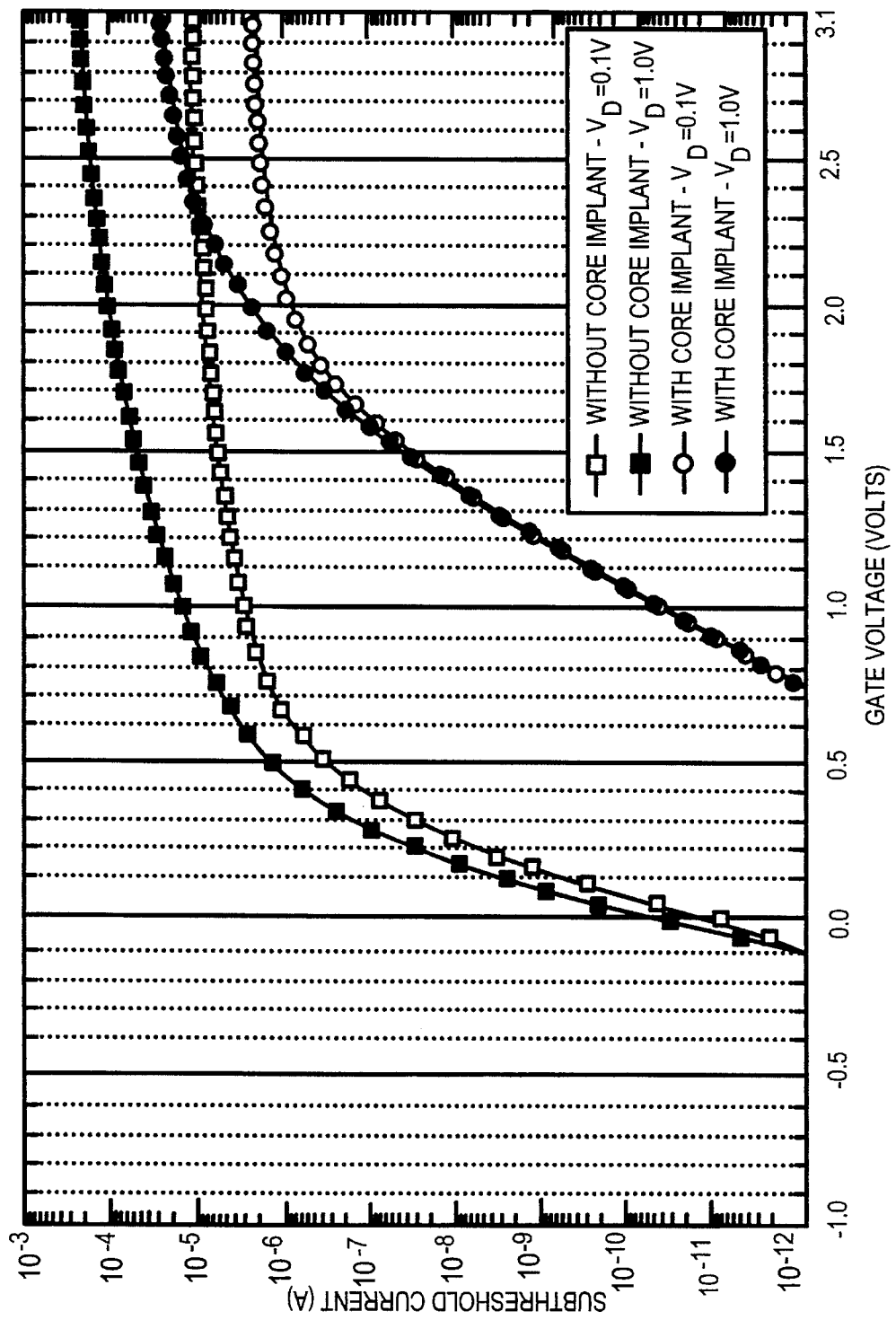
FIG. 5 is a graph of subthreshold current versus gate voltage for a prior art cell and a present invention cell illustrating the improved subthreshold slope obtained in the present invention.

FIG. 5 is a graph of subthreshold current (in amps) versus gate voltage (in volts), which illustrates the improvement in transconductance and subthreshold slope for a cell with a reduced core cell implant. The plot having square points represents the data gathered using a cell with a reduced core cell implant, while the plot having circle points represents the data gathered using a cell with a typical core cell implant. As shown by the two plots, the cell substantially without the core cell implant has a greater transconductance and a subthreshold slope closer to an ideal vertical slope than the cell with the core cell implant.

Although the cell structure substantially without a core implant produces the desired reduction in discharging time, a problem in drain disturbance may arise during a discharge operation on an unselected charged cell. Accordingly, in order to avoid this problem, shifting the voltage potentials, Vpp and Vcc, applied to cell during the discharge operation proportionately, has been found to work well by the inventors. The graph of FIG. 6 further illustrates that the shifting of the voltage potentials to avoid the drain disturbance problem does not adversely affect the discharge time reduction caused by the reduction in the core cell implant.

Figure 6:
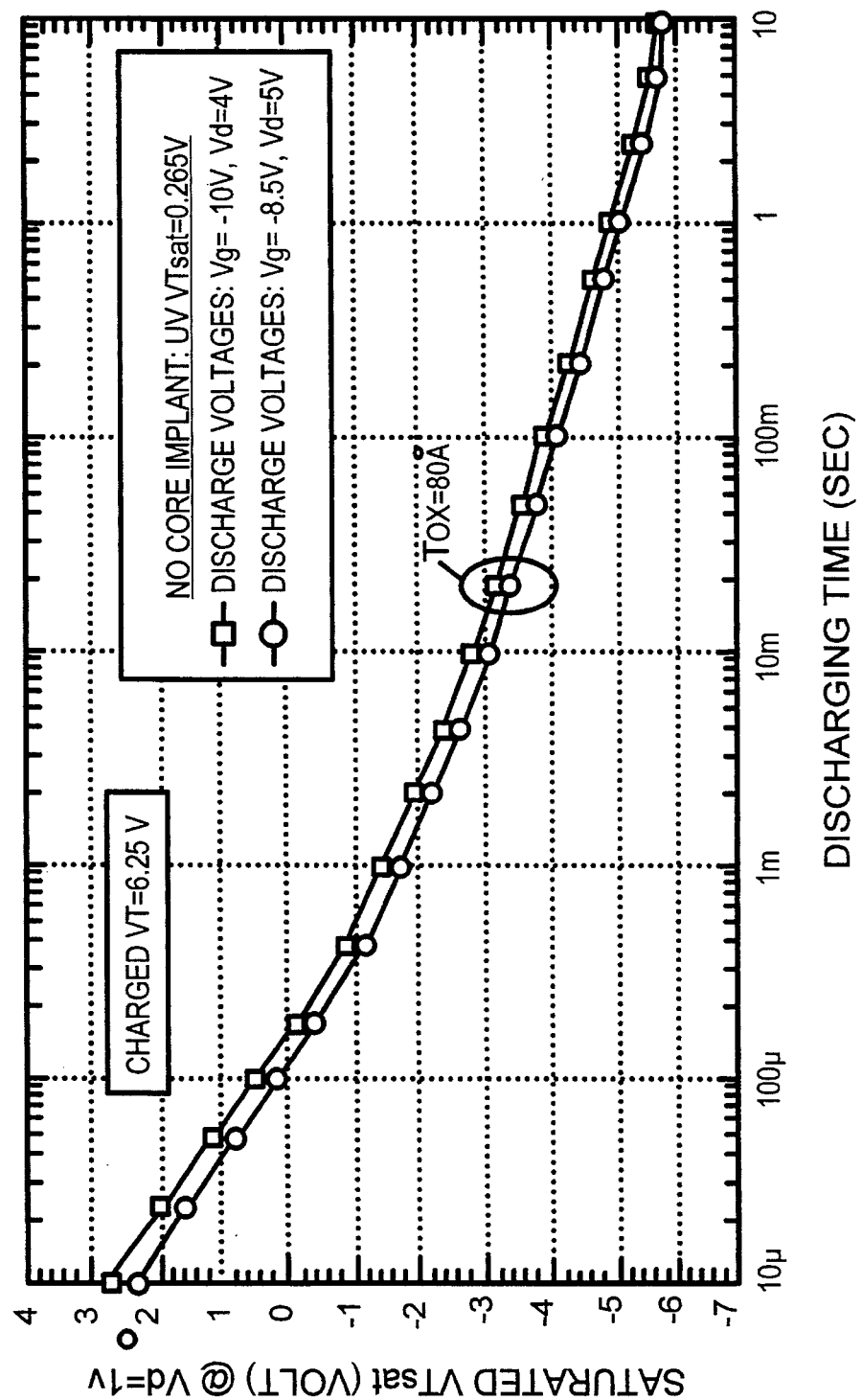
FIG. 6 is a graph of discharge threshold voltage versus discharge time for two cells formed in accordance with the present invention having proportioned voltage bias conditions.

For two cells having a tunnel oxide thickness of about 80 angstroms, a reduced core cell implant and a $UVV_t$ of about 0 V, the plot having square points in FIG. 6 illustrates the discharge time of a cell having a $V_{pp}=-10$ V and a $V_{cc}=4$ V, while the plot having circle points illustrates the discharge time of a cell having a $V_{pp}=-8.5$ V and a $V_{cc}=5$. As shown, the two cells have corresponding discharge times, so that a shift in the applied voltages to avoid the drain disturbance problem does not significantly adversely affect the achievement of an improvement in discharge time. Thus, a particular cell in an array of cells is appropriately discharged without disturbing the surrounding cells.

A further possible problem in punchthrough may occur as a result of the reduced surface doping of the cell for a cell formed in accordance with the present invention, as is appreciated to those skilled in the art. Accordingly, by way of example, instead of having a core cell devoid of a core implant, a low $UVV_t$ similarly results by using a heavily doped core with a normal p-type core implant and compensating the surface of the core with an n-type implant, such as arsenic, to shift the $UVV_t$ to below 0 V. Of course, mobility in the cell is reduced by the addition of the n-type dopant, but the core implant profile has reduced p-type dopant at the surface of the core to appropriately lower the $UVV_t$.

Another way to eliminate punchthrough would be to use a high energy core implant, whereby the resultant surface concentration of dopant will be low to achieve a low $UVV_t$ at the same time the concentration below the surface will be high to prevent punchthrough. As an example, a high energy implant of boron at an energy level of at least 180 kilo electron volts (KeV) would be utilized to shift the core implant.

Although the present invention has been described in accordance with the embodiments shown, one of ordinary skill in the art will recognize that there could be variations to the embodiment and those variations would be within the spirit and scope of the present invention.

For example, although the reduction in $UVV_t$ has been described as a result of reducing a surface doping, the work function of the floating gate could also be changed to reduce the $UVV_t$. However, it should be appreciated that a change in the work function would be more involved, requiring greater changes to the method of forming the cell than the method described in accordance with the present invention.

Accordingly, many modifications may be made by one of ordinary skill without departing from the spirit and scope of the present invention, the scope of which is defined solely by the following claims.

We claim:

1. A method for reducing a discharge time of a Flash EPROM cell, the cell having an ultraviolet voltage threshold, $UVV_t$, and an operational discharge threshold voltage, $V_t$, the method comprising:

setting the $UVV_t$ below the operational discharge $V_t$ of the cell; and providing a charge pump supply voltage to the cell.

2. The method of claim 1 wherein the step of setting further comprises reducing the $UVV_t$ to about 0 V.

3. The method of claim 1 wherein the step of reducing further comprises the step of reducing a core implant of a p-type dopant into a substrate of the cell.

4. The method of claim 3 wherein the p-type dopant comprises boron.

5. The method of claim 3 wherein the step of reducing eliminates the core implant.

6. The method of claim 3 further comprising decreasing a voltage potential applied at a drain of the cell and increasing the magnitude of negative voltage potential applied at a gate of the cell, wherein a drain disturb on an unselected charged cell during the discharge of the cell is reduced.

7. The method of claim 3 wherein the reduction in the core cell implant further increases mobility and transconductance for the cell.

8. A method for decreasing a discharge time of a Flash EPROM cell while reducing punchthrough, the method comprising the steps of:

providing a core cell implant of a first dopant into a substrate of the cell, wherein punchthrough is reduced; and providing a surface doping of a second dopant into a core of the substrate, wherein $UVV_t$ in the cell is reduced.

9. The method of claim 8 wherein the first dopant is boron.

10. The method of claim 8 wherein the second dopant is arsenic.

11. The method of claim 8 wherein the step of reducing forces an ultraviolet threshold voltage UVVt to about 0 V.

12. A method for reducing a discharge time of a Flash EPROM cell while reducing punchthrough, the method comprising the steps of:

providing a high energy core cell implant of a p type dopant into a substrate of the cell; and doping a low dopant concentration at a surface of the core to reduce $UVV_t$ and a high dopant concentration at lower than the surface to reduce punchthrough.

13. The method of claim 12 wherein the first dopant is boron.

14. The method of claim 12 wherein the high energy core implant is provided at an energy level of at least 180 kilo electron volts (KeV).

* * * * *